United States Patent [19]

Yoon

[11] Patent Number: 5,438,543

[45] Date of Patent: Aug. 1, 1995

[54] SEMICONDUCTOR MEMORY USING LOW POWER SUPPLY VOLTAGE

[75] Inventor: Sei-Seung Yoon, Seoul, Rep. of Korea

[73] Assignee: Samsung Electronics Co., Ltd., Kyungki-do, Rep. of Korea

[21] Appl. No.: 223,120

[22] Filed: Apr. 5, 1994

[30] Foreign Application Priority Data

Apr. 6, 1993 [KR] Rep. of Korea ................... 1993-5724

[51] Int. Cl.[6] .............................................. G11C 7/00
[52] U.S. Cl. ................................ 365/189.11; 365/207; 365/208
[58] Field of Search ................... 365/189.11, 208, 207, 365/190; 307/530

[56] References Cited

U.S. PATENT DOCUMENTS

| | | | |
|---|---|---|---|
| 4,601,017 | 7/1986 | Mochizuki et al. | 365/189.11 |
| 4,625,300 | 11/1986 | McElroy | 365/207 |
| 4,951,256 | 8/1990 | Tobita | 365/208 |
| 5,127,739 | 7/1992 | Duvvury et al. | 365/189.11 |
| 5,162,681 | 11/1992 | Lee | 365/189.11 X |

Primary Examiner—Joseph A. Popek
Assistant Examiner—Son Dinh
Attorney, Agent, or Firm—Robert A. Westerlund; Stephen R. Whitt; Charles R. Donohoe

[57] ABSTRACT

A peripheral/refresh control circuit for a semiconductor memory device, e.g., a dynamic random access memory (DRAM), which includes a first pull-up device connected between a supply voltage and the pull-up node of a sense amplifier, the first pull-up device having a first mode of operation wherein the power supply voltage is coupled to the pull-up node and a second mode of operation wherein the power supply voltage is isolated from the pull-up node, a second pull-up device coupled between a boosting voltage and the pull-up node, the second pull-up device having a first mode of operation wherein the boosting voltage is coupled to the pull-up node and a second mode of operation wherein the boosting voltage is isolated from the pull-up node, a first pull-up control circuit for selectively switching the first pull-up device between its first and second modes of operation, and a second pull-up control circuit for selectively switching the second pull-up device between its first and second modes of operation.

20 Claims, 4 Drawing Sheets

SEMICONDUCTOR MEMORY USING LOW POWER SUPPLY VOLTAGE

BACKGROUND OF THE INVENTION

The present invention relates generally to high density semiconductor memories which use a low voltage power supply, and, more particularly, to a high density semiconductor memory of this type having improved sense amplifier and refresh circuits.

In general, the continuing increases in the density of semiconductor memory devices have necessitated the use of commensurately lower power supply voltages therefor. More particularly, the increases in the density of semiconductor memory devices entails commensurate increases in the scale of integration of the circuit elements thereof. This ultimately results in smaller intervals between signal transmission lines, thinner gate oxide films for the MOS transistors, and, in general, a miniaturization of all of the circuit elements of the memory devices. The power supply voltage level used in such higher density semiconductor memory devices has to be decreased in order to prevent damage to these miniaturized circuit elements, and thus, to ensure reliability of operation of these memory devices. For example, a power supply voltage of 1.5V is currently being utilized in 64Mb DRAMs (dynamic random access memories).

The use of lower power supply voltages has led to the following problems. Namely, the use of lower power supply voltages has led to an increase in the soft error rates caused by alpha particles, and instabilities in the refresh voltage used to dynamically refresh the memory cells of a DRAM to compensate for charge which leaks from the memory cells during normal operation and used to restore the charge discharged from a memory cell after a read operation. Further, the use of lower power supply voltages has caused a commensurate reduction of the voltage difference between the power supply voltage and ground, thereby lowering the sensing margin of the sense amplifiers and consequently increasing the bit error rate for both read and write operations.

The above problems are particularly acute with respect to read or write operations regarding binary "1" data. Generally, binary "1" data is represented by a positive charge stored in the storage capacitor of a selected memory cell. During a read or refresh operation, this binary "1" data is read from the selected memory cell in the following manner. The charge stored on the storage capacitor of the selected memory cell is transferred through an access or select transistor of the memory cell to one of a pair of complementary bit lines, which is sometimes referred to as a charge sharing operation. A sense amplifier functions to amplify the resultant voltage difference between the complementary bit lines, in order to thereby establish the power supply voltage on one of the pair of bit lines and the ground voltage on the complementary one of the pair of bit lines. During a read operation, the data thus represented by the respective voltages on the complementary bit lines is then coupled to a corresponding pair of complementary data input/output (I/O) lines.

Before the end of the read or refresh cycle, the storage capacitor of the thusly discharged selected memory cell must be recharged, to thereby restore the read-out data. However, since the level of the restore voltage is limited to the low level of the power supply voltage, the quantity of charge which can be supplied to the storage capacitor of the selected memory cell is not sufficiently high to ensure adequate immunity from soft errors caused by alpha particles, thereby resulting in an undesirable data error rate.

One attempt at overcoming the above-described shortcomings of the presently available low-power, high-density semiconductor memory devices is embodied in a sense amplifier and peripheral circuit depicted in FIG. 1 and disclosed in U.S. Pat. No. 4,855,628, which is assigned to the assignee of the present application. With reference to FIG. 1, it can be seen that the sense amplifier includes an n-type latch consisting of NMOS transistors 20 and 21, and a p-type latch consisting of PMOS transistors 28 and 29. The peripheral circuit includes NMOS transistors 25, 26, and 27 which function to precharge and equalize the voltage of the bit lines BL and /BL to a reference voltage Vref, and NMOS transistors 31 and 32, which, in combination with NMOS capacitors 33 and 34, function to restore the charge on a selected memory cell 1 to a level of Vcc+alpha, in order to compensate for soft error, i.e., the loss of charge from the memory cell due to alpha particles.

The operation of the circuitry described above is discussed below with reference to both FIGS. 1 and 2, assuming that binary "1" data stored in the memory cell 1 is to be read therefrom (either during a refresh or memory access operation, such as a read operation).

When the semiconductor memory chip (not shown) containing the depicted circuitry becomes active, i.e., when the row address strobe signal (/RAS) goes to a logic "low" level, the word line WL1 is activated (i.e., raised to a logic "high" voltage level), thus turning on the select or access transistor 10 of the memory cell 1, which, in turn, allows the charge stored in the memory cell 1 to be transferred to the bit line BL. Thereafter, a control signal O1 is driven to a logic "high" level, thereby activating the n-type latch. The operation of the n-type latch causes the voltage on the bit line /BL to be discharged to ground (OV). After a prescribed period of time, a control signal O2 is driven to a logic "low" level and a control signal O3 is driven to a logic "high" level, thereby turning on the PMOS transistor 30 and activating the p-type latch. The operation of the ptype latch causes the voltage on the bit line BL to rise to the power supply voltage (Vcc)level.

Next, the charge (binary "1" bit of data) read from the selected memory cell 1 is restored (refreshed). More particularly, the row address strobe signal (/RAS) goes "high", the control signal O2 is driven to a logic "high" level, and the control signal O3 is driven to a logic "low" level, thereby turning off the PMOS transistor 30. Next, the control signal O4 is driven to a logic "high" level, thereby causing the voltage Vcc +alpha stored on the NMOS capacitors 33 and 34 to be transferred to the node 41 of the sense amplifier, and subsequently, through the NMOS transistor 28 of the n-type latch and the select or pass transistor 10 of the selected memory cell 1 to the storage capacitor 14 of the selected memory cell 1. Thus, the charge which was originally stored on the storage capacitor 14 and read out onto the bit line BL is restored, or refreshed.

Although the above-described circuit is effective to raise the voltage level of the memory cell to Vcc+ alpha, and thus minimize soft errors, the size of the capacitors 33 and 34 utilized for this purpose occupy valuable real estate on the semiconductor memory chip, thereby constraining the achievable density thereof. The present invention minimizes this shortcoming of the above-described circuit.

SUMMARY OF THE INVENTION

The present invention encompasses a peripheral/refresh control circuit for a semiconductor memory device, e.g., a dynamic random access memory (DRAM), which includes a first pull-up device connected between a supply voltage and the pull-up node of a sense amplifier, the first pull-up device having a first mode of operation wherein the power supply voltage is coupled to the pull-up node and a second mode of operation wherein the power supply voltage is isolated from the pull-up node, a second pull-up device coupled between a boosting voltage and the pull-up node, the second pull-up device having a first mode of operation wherein the boosting voltage is coupled to the pull-up node and a second mode of operation wherein the boosting voltage is isolated from the pull-up node, a first pull-up control circuit for selectively switching the first pull-up device between its first and second modes of operation, and a second pull-up control circuit for selectively switching the second pull-up device between its first and second modes of operation.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
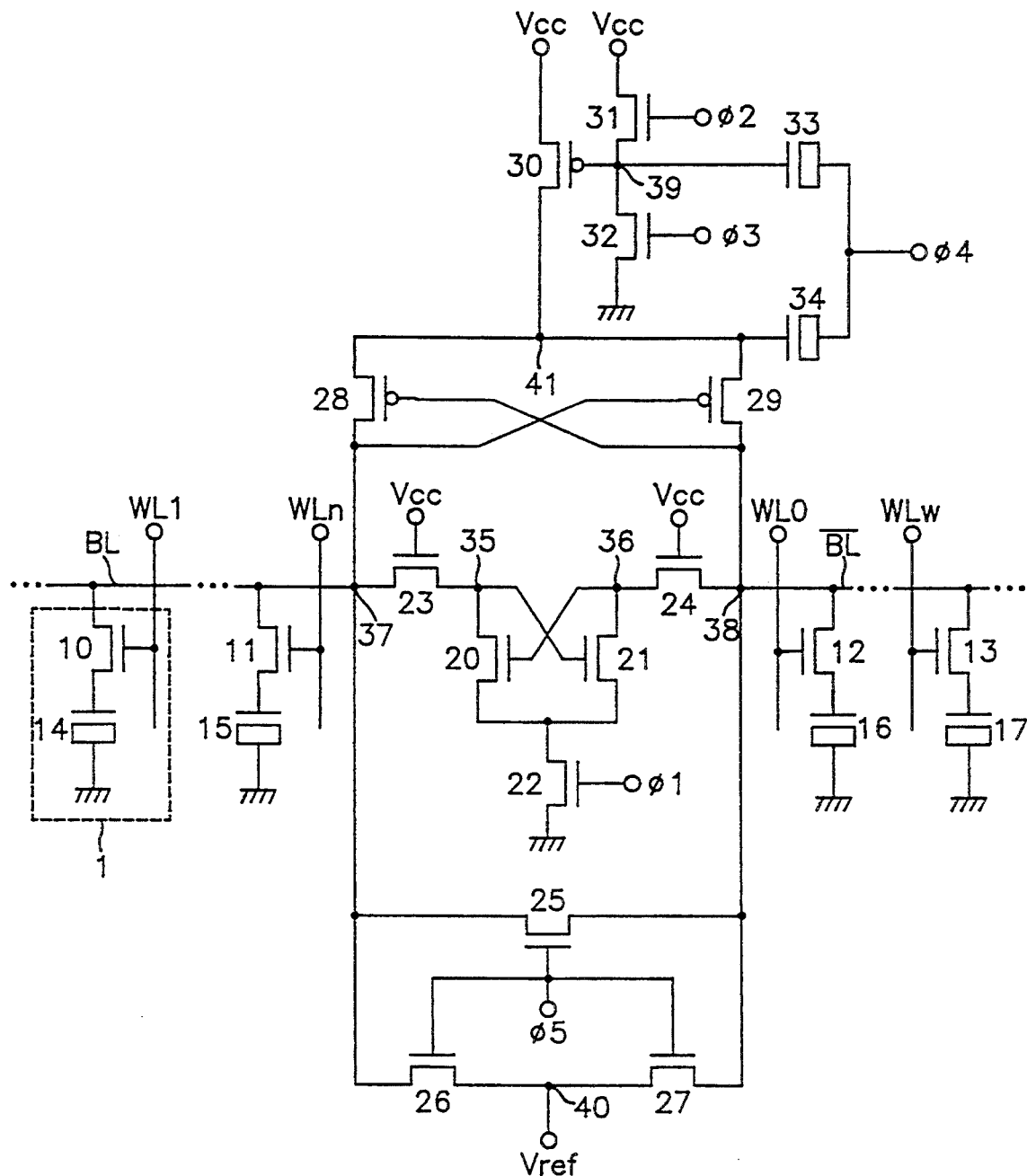
FIG. 1 is a schematic diagram of a conventional sense amplifier and peripheral circuit of a semiconductor memory device.
Figure 2:
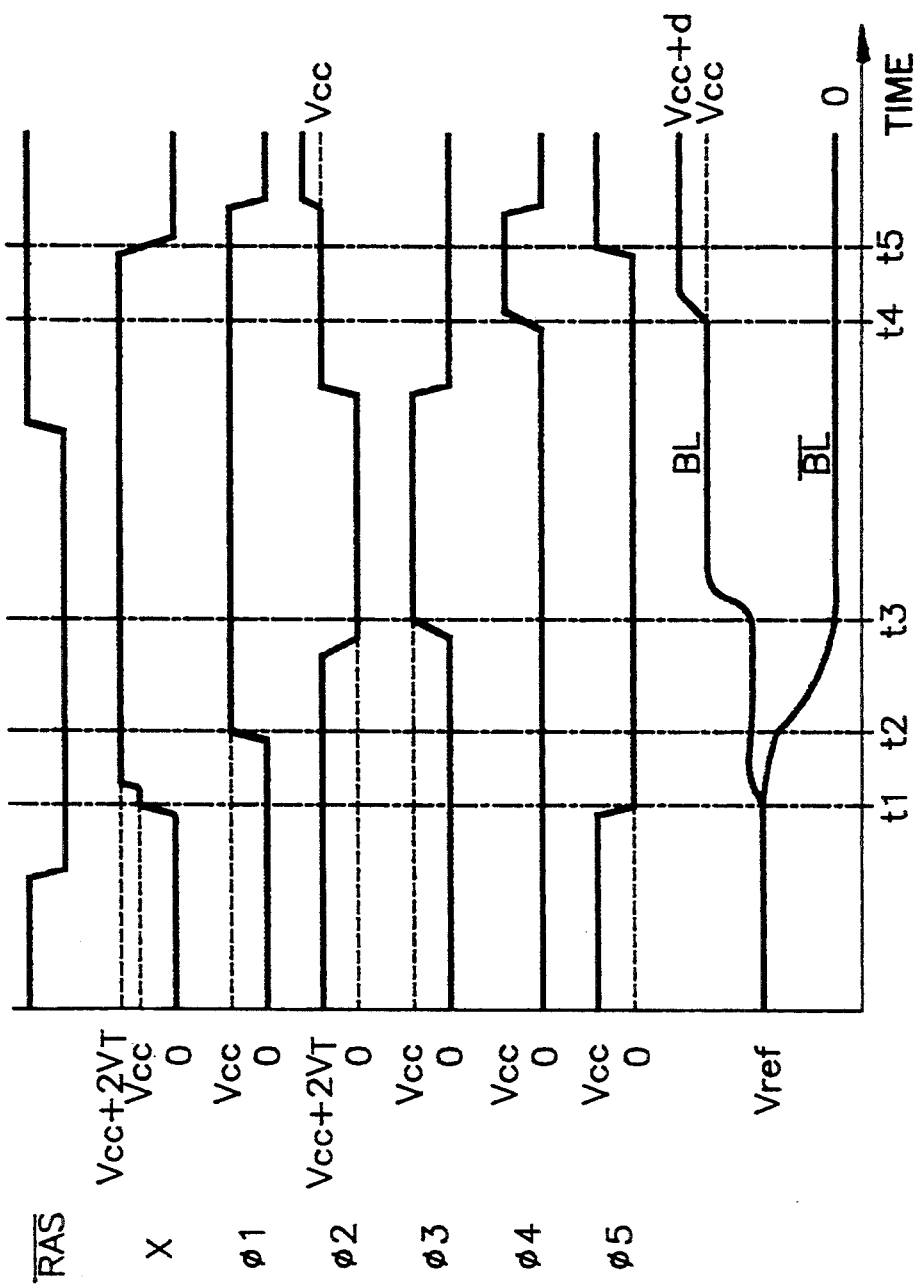
FIG. 2 is a timing diagram depicting various signals utilized in the conventional sense amplifier and peripheral circuit depicted in FIG. 1.
Figure 3:
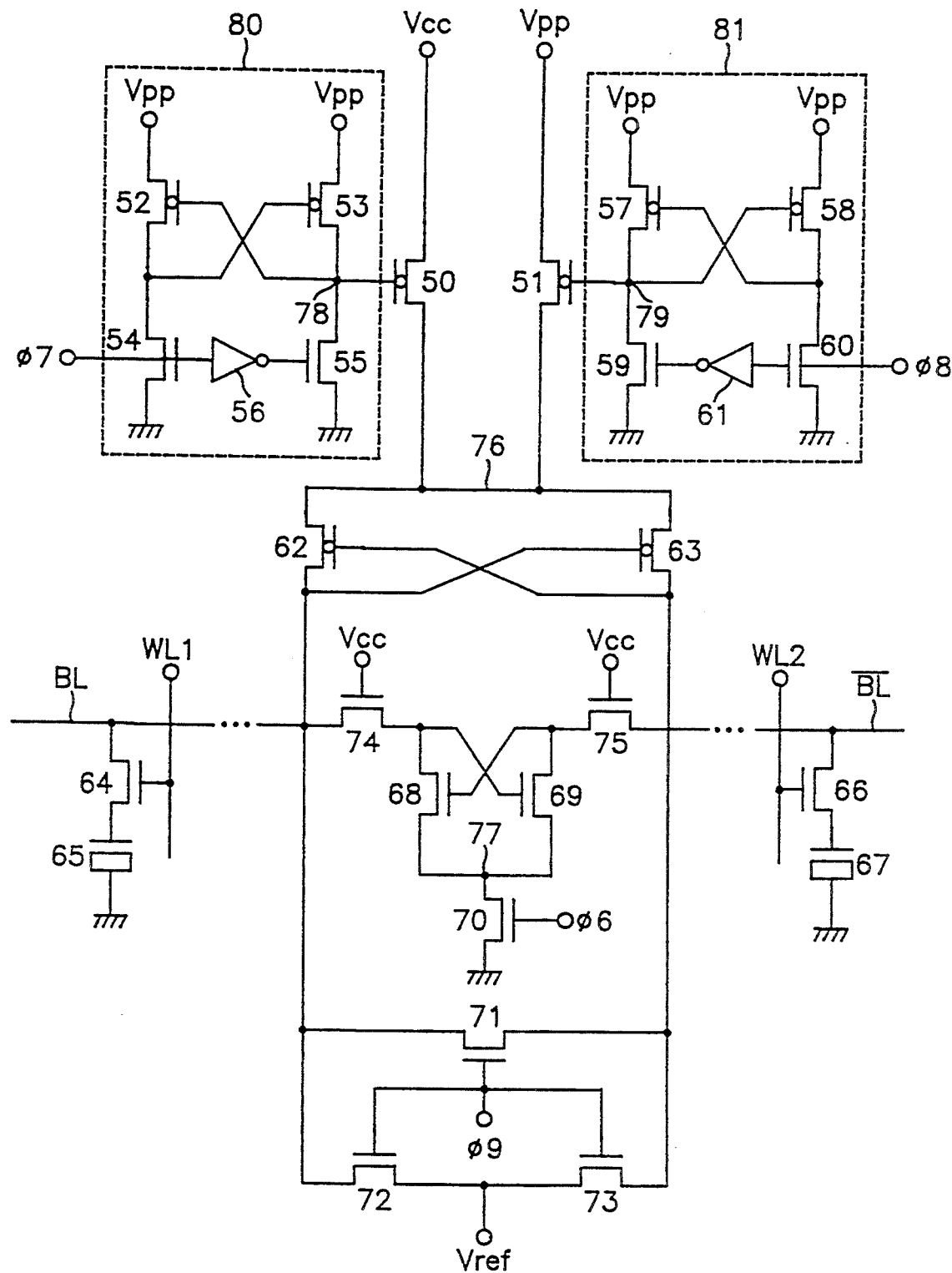
FIG. 3 is a sense amplifier and peripheral circuit of a semiconductor memory device constructed in accordance with a preferred embodiment of the present invention.

With reference now to FIG. 3, there can be seen a sense amplifier and peripheral circuit for a semiconductor memory device constructed in accordance with a preferred embodiment of the present invention. The basic architecture of the sense amplifier is the same as that depicted in FIG. 1 and described hereinabove. More particularly, the sense amplifier depicted in FIG. 3 includes an n-type latch consisting of NMOS transistors 68 and 69, and a p-type latch consisting of PMOS transistors 62 and 63. The sense amplifier further includes a precharge and equalization circuit consisting of NMOS transistors 71, 72 and 73, which function to precharge and equalize the voltage on the bit lines BL and /BL to a reference voltage Vref, which is coupled to the source electrodes of the NMOS transistors 72 and 73. Further, the sense amplifier includes charge transfer NMOS transistors 74 and 75 for coupling the charge or voltage on the bit lines BL and /BL, respectively, to the n-type latch of the sense amplifier.

Additionally, the sense amplifier includes an NMOS transistor 70 connected between a pull-down node 77 of the n-type latch and ground, and whose gate electrode is coupled to a control signal O6. A first bit line BL is connected to a first memory cell comprised of a select transistor 64 and a storage capacitor 65 and a second bit line /BL is connected to a second memory cell comprised of a select transistor 66 and a storage capacitor 67. A first word line WL1 is coupled to the gate electrode of the select transistor 64 of the first memory cell, and a second word line WL2 is coupled to the gate electrode of the select transistor 66 of the second memory cell. Of course, as is well-known to those skilled in the semiconductor memory art, the semiconductor memory device includes an entire matrix of word lines and bit lines and a corresponding array of memory cells like the ones shown in FIG. 3, and corresponding sense amplifiers like the one shown in FIG. 3 for each pair of bit lines.

In accordance with a preferred embodiment of the present invention, the semiconductor memory device further includes a peripheral circuit for controlling the refreshing or recharging of the memory cells to restore the data stored therein. As shown in FIG. 3, the peripheral circuit includes a power supply voltage pull-up control circuit 80, a boosting voltage pull-up control circuit 81, a power supply voltage pull-up transistor 50, and a boosting voltage pull-up transistor 51, each of which are separately described below.

The power supply voltage pull-up transistor 50 is preferably a PMOS transistor coupled between the power supply voltage Vcc and a common source node 76 between the PMOS transistors 62 and 63 of the p-type latch of the sense amplifier. The boosting voltage pull-up transistor 51 is preferably a PMOS transistor coupled between a boosting voltage Vpp and the common source node 76. The gate electrode of the power supply voltage transistor 50 is coupled to the output of the power supply voltage pull-up control circuit 80. The gate electrode of the boosting voltage pull-up transistor 51 is coupled to the output of the boosting voltage pull-up control circuit 81.

The power supply voltage pull-up control circuit 80 is preferably implemented in the form of a latch circuit toggled by a control signal O7. More particularly, the power supply voltage pull-up control circuit 80 includes a first PMOS transistor 52 and a first NMOS transistor 54 serially connected between the boosting voltage Vpp and ground, and a second PMOS transistor 53 and a second NMOS transistor 55 serially connected between the boosting voltage Vpp and ground. The gate electrode of the first PMOS transistor 52 is coupled to a common node 78 between the drain electrode of the second PMOS transistor 53 and the source electrode of the second NMOS transistor 55. The gate electrode of the second PMOS transistor 53 is coupled to the corresponding common node between the drain electrode of the first PMOS transistor 52 and the source electrode of the first NMOS transistor 54. The signal appearing at the node 78 of the power supply voltage pull-up control circuit 80 constitutes the output signal thereof. The gate electrode of the first NMOS tranistor 54 is coupled to the control signal O7 and the gate electrode of the second NMOS transistor 55 is coupled to the output of an inverter 56, which is the inverse of the control signal O7.

The boosting voltage pull-up control circuit 81 is preferably implemented in the form of a latch circuit toggled by a control signal O8. More particularly, the boosting voltage pull-up control circuit 81 includes a first PMOS transistor 58 and a first NMOS transistor 60 serially connected between the boosting voltage Vpp and ground, and a second PMOS transistor 57 and a second NMOS transistor 59 serially connected between the boosting voltage Vpp and ground. The gate electrode of the first PMOS transistor 58 is coupled to a common node 79 between the drain electrode of the second PMOS transistor 57 and the source electrode of the second NMOS transistor 59. The gate electrode of the second PMOS transistor 57 is coupled to the corresponding common node between the drain electrode of the first PMOS transistor 58 and the source electrode of the first NMOS transistor 60. The signal appearing at the node 79 of the boosting voltage pull-up control circuit 81 constitutes the output signal thereof. The gate electrode of the first NMOS transistor 60 is coupled to the control signal O8 and the gate electrode of the second NMOS transistor 59 is coupled to the output of an inverter 61, which is the inverse of the control signal O8.

Figure 5:
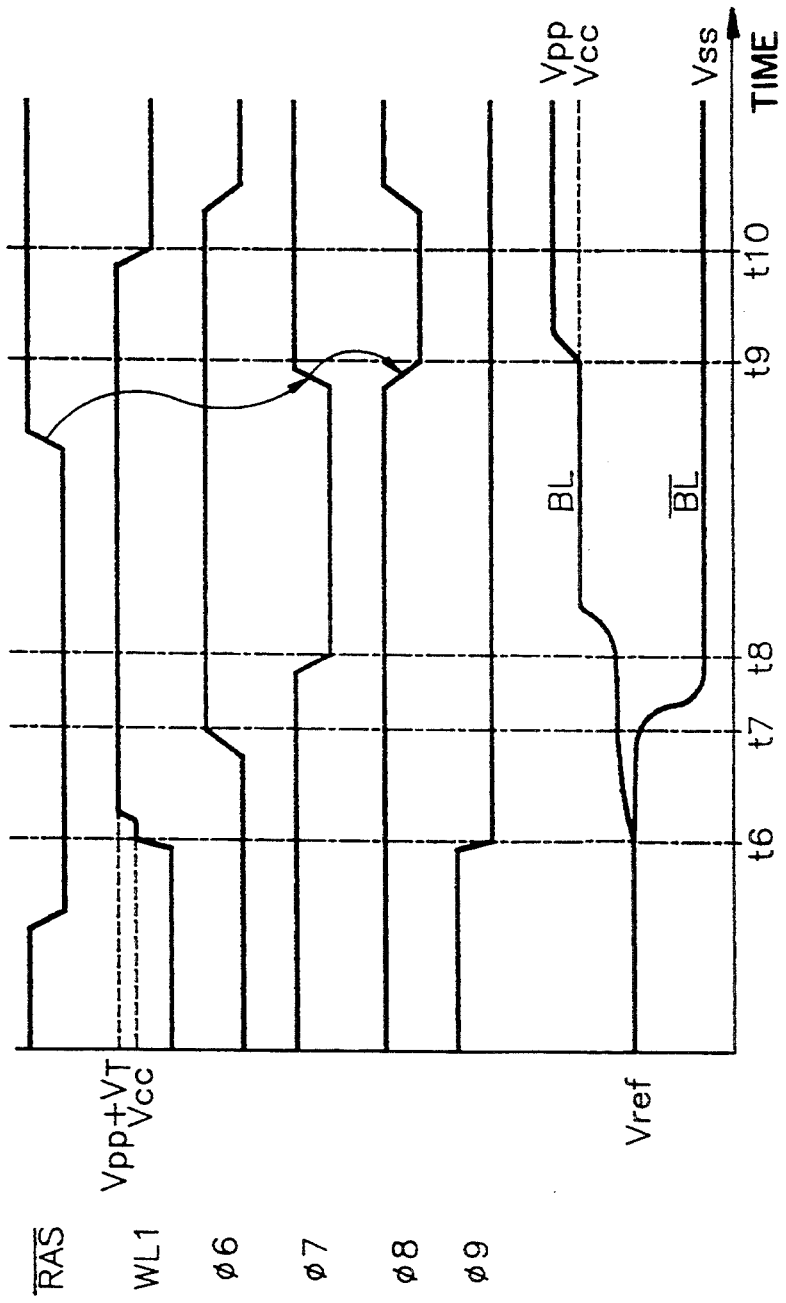

The operation of the inventive circuitry described above is discussed below with reference to both FIGS. 3 and 5, assuming that binary "1" data stored in a selected memory cell comprised of the select transistor 64 and the storage capacitor 65 is to be read therefrom (either during a memory refresh or memory access operation, such as a read operation).

When the semiconductor memory chip (not shown) containing the depicted circuitry becomes active, i.e., when the row address strobe signal (/RAS) goes to a logic "low" level, the word line WL1 is activated (i.e., raised to a logic "high" voltage level of Vpp +Vt, where Vt is the threshold voltage of a MOS transistor), thus turning on the select transistor 64 of the selected memory cell, which, in turn, allows the charge stored in the selected memory cell to be transferred to the bit line BL. This charge sharing operation occurs during the time interval t6–t7. At the time t7, the control signal O6 is driven to a logic "high" level, thereby turning on the NMOS transistor 70 and activating the n-type latch comprised of the cross-coupled NMOS transistors 68 and 69, thus initiating the sensing operation of the sense amplifier. Of course, since the voltage on the bit line BL is high because a binary "1" data bit has been read from the selected memory cell, the NMOS transistor 69 is turned on, thereby causing the voltage on the bit line /BL to be discharged to ground (Vss).

At time t8, after the voltage on the bit line /BL has been discharged to Vss, the control signal O7 is driven to its logic "low" level, thus turning on the second NMOS transistor 55 of the power supply voltage pull-up control circuit 80, thereby lowering the output signal on the node 78 to its logic "low" level. The low level output signal on the node 78 turns on the PMOS power supply pull-up transistor 50, thereby raising the source node 76 of the sense amplifier to Vcc. Since the voltage on the bit line /BL is at Vss, the PMOS transistor 62 of the p-type latch is turned on, thus allowing the voltage Vcc to be transferred to the bit line BL.

Then, after a prescribed sensing time has elapsed, the row address strobe signal/RAS is driven to its logic "high" level. Thereafter, at time t9, the control signal O7 is driven to its logic "high" level, and the control signal O8 is driven to its logic "low" level. When the control signal O7 is at its logic "high" level, the output signal at the node 78 is driven to its logic "high" level, thereby turning off the PMOS power supply pull-up transistor 50. When the control signal O8 is at its logic "low" level, the output signal at the node 79 of the boosting voltage pull-up control circuit 81 is driven to its logic "low" level, thereby turning on the boosting voltage PMOS pull-up transistor 51, thus coupling the boosting voltage Vpp to the common source node 76 of the sense amplifier.

Since the PMOS transistor 62 of the p-type latch and the select transistor 64 of the selected memory cell are already turned on, as discussed above, the boosting voltage Vpp is transferred to the storage capacitor 65 of the memory cell, to thereby restore the binary "1" data read therefrom. Since the boosting voltage Vpp is greater than the power supply voltage Vcc, the immunity of the selected memory cell to soft errors due to alpha particles is significantly enhanced.

Figure 4:
FIG. 4 is a circuit for generating the boost voltage Vpp utilized in the inventive circuit depicted in FIG. 3; and, FIG. 5 is a timing diagram depicting various signals utilized in the inventive circuit depicted in FIG. 3.

With reference now to FIG. 4, there can be seen a preferred embodiment of a circuit for generating the boosting voltage Vpp, which receives at its input a clock signal Oosc supplied by an oscillator (not shown) and generates at its output the boosting voltage Vpp. This boosting voltage generating circuit, and variations thereof, are disclosed in Korean Patent Application Nos. 91-19740, 91-20137, 91-22108, and 92-11242, all of which are assigned to the assignee of the present application. Of course, the particular implementation of the boosting voltage generating circuit is not limiting to the present invention.

The present invention having now been described, it will be appreciated by those skilled in the art that the peripheral/refresh control circuit of the present invention is more efficient and occupies considerably less surface area of the semiconductor memory device as compared to the presently available refresh control circuits.

Although the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. In a semiconductor memory device having an array of memory cells each comprised of a select transistor and a storage capacitor, a sense amplifier having a pull-up node and a pull-down node, a plurality of word lines each of which is coupled to the gate electrode of the select transistor of each of a plurality of the memory cells arranged in a common row, and a pair of complementary bit lines coupled to respective first and second terminals of the sense amplifier and to an electrode of the select transistor of respective ones of a plurality of memory cells arranged in corresponding columns, a peripheral circuit, comprising:

a first pull-up device connected between a supply voltage and said pull-up node of said sense amplifier, said first pull-up device having a first mode of operation wherein said supply voltage is coupled to said pull-up node and a second mode of operation wherein said supply voltage is isolated from said pull-up node;

a second pull-up device coupled between a boosting voltage greater than said supply voltage and said pull-up node of said sense amplifier, said second pull-up device having a first mode of operation wherein said boosting voltage is coupled to said pull-up node and a second mode of operation wherein said boosting voltage is isolated from said pull-up node;

a first pull-up control circuit for selectively switching said first pull-up device between its said first and second modes of operation; and, a second pull-up control circuit for selectively switching said second pull-up device between its said first and second modes of operation.

2. The peripheral circuit as set forth in claim 1, wherein:

said first pull-up control circuit is responsive to a first control signal for switching said first pull-up device to its said first mode of operation when said first control signal is at a first logic level and for switching said first pull-up device to its said second mode of operation when said first control signal is at a second logic level; and, said second pull-up control circuit is responsive to a second control signal for switching said second pull-up device to its said first mode of operation when said second control signal is at a first logic level and for switching said second pull-up device to its said second mode of operation when said second control signal is at a second logic level.

3. The peripheral circuit as set forth in claim 2, wherein said first control signal is driven to its said second logic level after charge stored on a selected one of said memory cells has been transferred to a corresponding one of said complementary pair of bit lines, and a sensing operation of the sense amplifier has been initiated.

4. The peripheral circuit as set forth in claim 3, wherein said second control signal is driven to its said second logic level when said first control signal is driven back from its said second logic level to its said first logic level.

5. The peripheral circuit as set forth in claim 4, wherein said first control signal is driven from its said second logic level to its said first logic level after a voltage difference between said complementary pair of bit lines has been amplified by the sense amplifier.

6. The peripheral circuit as set forth in claim 1, wherein said first pull-up device comprises a first pull-up PMOS transistor having a first electrode coupled to said supply voltage, a second electrode coupled to said pull-up node of said sense amplifier, and a gate electrode.

7. The peripheral circuit as set forth in claim 6, wherein said second pull-up device comprises a second pull-up PMOS transistor having a first electrode coupled to said boosting voltage, a second electrode coupled to said pull-up node of said sense amplifier, and a gate electrode.

8. The peripheral circuit as set forth in claim 7, wherein said first pull-up control circuit comprises:

a first PMOS transistor having a first electrode coupled to said boosting voltage, a second electrode, and a gate electrode;

a first NMOS transistor having a first electrode coupled to said second electrode of said first PMOS transistor, a second electrode coupled to a reference voltage, and a gate electrode;

a second PMOS transistor having a first electrode coupled to said boosting voltage, a second electrode, and a gate electrode;

a second NMOS transistor having a first electrode coupled to said second electrode of said second PMOS transistor, a second electrode coupled to said reference voltage, and a gate electrode;

wherein said first control signal is coupled to said gate electrode of said first NMOS transistor and the inverse of said first control signal is coupled to said gate electrode of said second NMOS transistor;

wherein said gate electrode of said first PMOS transistor is coupled to a first common node between said second electrode of said second PMOS transistor and said first electrode of said second NMOS transistor;

wherein said gate electrode of said second PMOS transistor is coupled to a second common node between said second electrode of said first PMOS transistor and said first electrode of said first NMOS transistor; and, wherein said first common node comprises an output node of said first pull-up control circuit, said output node being coupled to said gate electrode of said first pull-up PMOS transistor.

9. The peripheral circuit as set forth in claim 8, wherein said second pull-up control circuit comprises:

a first PMOS transistor having a first electrode coupled to said boosting voltage, a second electrode, and a gate electrode;

a first NMOS transistor having a first electrode coupled to said second electrode of said first PMOS transistor, a second electrode coupled to a reference voltage, and a gate electrode;

a second PMOS transistor having a first electrode coupled to said boosting voltage, a second electrode, and a gate electrode;

a second NMOS transistor having a first electrode coupled to said second electrode of said second PMOS transistor, a second electrode coupled to said reference voltage, and a gate electrode;

wherein said second control signal is coupled to said gate electrode of said first NMOS transistor and the inverse of said second control signal is coupled to said gate electrode of said second NMOS transistor;

wherein said gate electrode of said first PMOS transistor is coupled to a first common node between said second electrode of said second PMOS transistor and said first electrode of said second NMOS transistor;

wherein said gate electrode of said second PMOS transistor is coupled to a second common node between said second electrode of said first PMOS transistor and said first electrode of said first NMOS transistor; and, wherein said first common node comprises an output node of said second pull-up control circuit, said output node being coupled to said gate electrode of said second pull-up PMOS transistor.

10. The peripheral circuit as set forth in claim 9, wherein said sense amplifier comprises:

an n-type latch comprised of first and second cross-coupled NMOS transistors;

a p-type latch comprised of first and second cross-coupled PMOS transistors;

wherein said first NMOS transistor of said n-type latch has a first electrode coupled to a first one of said pair of complementary bit lines, a gate electrode coupled to a second one of said pair of complementary bit lines, and a second electrode;

wherein said second NMOS transistor of said n-type latch has a first electrode coupled to said second one of said pair of complementary bit lines, a gate electrode coupled to said first one of said pair of complementary bit lines, and a second electrode;

wherein said pull-down node of said sense amplifier comprises a common node between said second electrodes of said first and second NMOS transistors of said n-type latch;

a pull-down device coupled between said pull-down node and said reference voltage;

wherein said first PMOS transistor of said p-type latch has a first electrode coupled to said pull-up node of said sense amplifier, a gate electrode, and a second electrode coupled to said first one of said pair of complementary bit lines;

wherein said second PMOS transistor of said p-type latch has a first electrode coupled to said pull-up node of said sense amplifier, a gate electrode coupled to said second electrode of said first PMOS transistor of said p-type latch, and a second electrode coupled to said second one of said pair of complementary bit lines; and, wherein said gate electrode of said first PMOS transistor of said p-type latch is coupled to said second electrode of said second PMOS transistor of said p-type latch.

11. In a semiconductor memory device having an array of memory cells each comprised of a select transistor and a storage capacitor, a sense amplifier having a pull-up node and a pull-down node, a plurality of word lines each of which is coupled to the gate electrode of the select transistor of each of a plurality of the memory cells arranged in a common row, and a pair of complementary bit lines coupled to respective first and second terminals of the sense amplifier and to an electrode of the select transistor of respective ones of a plurality of memory cells arranged in corresponding columns, a peripheral circuit, comprising:

first pull-up means connected between a supply voltage and said pull-up node of said sense amplifier, said first pull-up means having a first mode of operation wherein said supply voltage is coupled to said pull-up node and a second mode of operation wherein said supply voltage is isolated from said pull-up node;

a second pull-up means coupled between a boosting voltage greater than said supply voltage and said pull-up node of said sense amplifier, said second pull-up means having a first mode of operation wherein said boosting voltage is coupled to said pull-up node and a second mode of operation wherein said boosting voltage is isolated from said pull-up node;

a first pull-up control means for selectively switching said first pull-up means between its said first and second modes of operation; and, a second pull-up control means for selectively switching said second pull-up means between its said first and second modes of operation.

12. The peripheral circuit as set forth in claim 11, wherein:

said first pull-up control means is responsive to a first control signal for switching said first pull-up means to its said first mode of operation when said first control signal is at a first logic level and for switching said first pull-up means to its said second mode of operation when said first control signal is at a second logic level; and, said second pull-up control means is responsive to a second control signal for switching said second pull-up means to its said first mode of operation when said second control signal is at a first logic level and for switching said second pull-up means to its said second mode of operation when said second control signal is at a second logic level.

13. The peripheral circuit as set forth in claim 12, wherein said first control signal is driven to its said second logic level after charge stored on a selected one of said memory cells has been transferred to a corresponding one of said complementary pair of bit lines, and a sensing operation of said sense amplifier has been initiated.

14. The peripheral circuit as set forth in claim 13, wherein said second control signal is driven to its said second logic level when said first control signal is driven back from its said second logic level to its said first logic level.

15. The peripheral circuit as set forth in claim 14, wherein said first control signal is driven from its said second logic level to its said first logic level after a voltage difference between said complementary pair of bit lines has been amplified by the sense amplifier.

16. The peripheral circuit as set forth in claim 11, wherein said first pull-up means comprises a first pull-up PMOS transistor having a first electrode coupled to said supply voltage, a second electrode coupled to said pull-up node of said sense amplifier, and a gate electrode.

17. The peripheral circuit as set forth in claim 16, wherein said second pull-up means comprises a second pull-up PMOS transistor having a first electrode coupled to said boosting voltage, a second electrode coupled to said pull-up node of said sense amplifier, and a gate electrode.

18. The peripheral circuit as set forth in claim 17, wherein said first pull-up control means comprises:

a first PMOS transistor having a first electrode coupled to said boosting voltage, a second electrode, and a gate electrode;

a first NMOS transistor having a first electrode coupled to said second electrode of said first PMOS transistor, a second electrode coupled to a reference voltage, and a gate electrode;

a second PMOS transistor having a first electrode coupled to said boosting voltage, a second electrode, and a gate electrode;

a second NMOS transistor having a first electrode coupled to said second electrode of said second PMOS transistor, a second electrode coupled to said reference voltage, and a gate electrode;

wherein said first control signal is coupled to said gate electrode of said first NMOS transistor and the inverse of said first control signal is coupled to said gate electrode of said second NMOS transistor;

wherein said gate electrode of said first PMOS transistor is coupled to a first common node between said second electrode of said second PMOS transistor and said first electrode of said second NMOS transistor;

wherein said gate electrode of said second PMOS transistor is coupled to a second common node between said second electrode of said first PMOS transistor and said first electrode of said first NMOS transistor; and, wherein said first common node comprises an output node of said first pull-up control means, said output node being coupled to said gate electrode of said first pull-up PMOS transistor.

19. The peripheral circuit as set forth in claim 18, wherein said second pull-up control means comprises:

a first PMOS transistor having a first electrode coupled to said boosting voltage, a second electrode, and a gate electrode;

a first NMOS transistor having a first electrode coupled to said second electrode of said first PMOS transistor, a second electrode coupled to a reference voltage, and a gate electrode;

a second PMOS transistor having a first electrode coupled to said boosting voltage, a second electrode, and a gate electrode;

a second NMOS transistor having a first electrode coupled to said second electrode of said second PMOS transistor, a second electrode coupled to said reference voltage, and a gate electrode;

wherein said second control signal is coupled to said gate electrode of said first NMOS transistor and the inverse of said second control signal is coupled to said gate electrode of said second NMOS transistor;

wherein said gate electrode of said first PMOS transistor is coupled to a first common node between said second electrode of said second PMOS transistor and said first electrode of said second NMOS transistor;

wherein said gate electrode of said second PMOS transistor is coupled to a second common node between said second electrode of said first PMOS transistor and said first electrode of said first NMOS transistor; and, wherein said first common node comprises an output node of said second pull-up control means, said output node being coupled to said gate electrode of said second pull-up PMOS transistor.

20. The peripheral circuit as set forth in claim 19, wherein said sense amplifier comprises:

an n-type latch comprised of first and second cross-coupled NMOS transistors;

a p-type latch comprised of first and second cross-coupled PMOS transistors;

wherein said first NMOS transistor of said n-type latch has a first electrode coupled to a first one of said pair of complementary bit lines, a gate electrode coupled to a second one of said pair of complementary bit lines, and a second electrode;

wherein said second NMOS transistor of said n-type latch has a first electrode coupled to said second one of said pair of complementary bit lines, a gate electrode coupled to said first one of said pair of complementary bit lines, and a second electrode;

wherein said pull-down node of said sense amplifier comprises a common node between said second electrodes of said first and second NMOS transistors of said n-type latch;

a pull-down device coupled between said pull-down node and said reference voltage;

wherein said first PMOS transistor of said p-type latch has a first electrode coupled to said pull-up node of said sense amplifier, a gate electrode, and a second electrode coupled to said first one of said pair of complementary bit lines;

wherein said second PMOS transistor of said p-type latch has a first electrode coupled to said pull-up node of said sense amplifier, a gate electrode coupled to said second electrode of said first PMOS transistor of said p-type latch, and a second electrode coupled to said second one of said pair of complementary bit lines; and, wherein said gate electrode of said first PMOS transistor of said p-type latch is coupled to said second electrode of said second PMOS transistor of said p-type latch.

* * * * *